United States Patent
Phaneuf et al.

(10) Patent No.: US 7,535,000 B2
(45) Date of Patent: May 19, 2009

(54) METHOD AND SYSTEM FOR IDENTIFYING EVENTS IN FIB

(75) Inventors: Michael William Phaneuf, Ottawa (CA); Ken Guillaume Lagarec, Gatineau (CA)

(73) Assignee: DCG Systems, Inc., Fremont, CA (US)

( * ) Notice: Subject to any disclaimer, the term of this patent is extended or adjusted under 35 U.S.C. 154(b) by 363 days.

(21) Appl. No.: 11/607,337

(22) Filed: Nov. 30, 2006

(65) Prior Publication Data

US 2008/0073580 A1 Mar. 27, 2008

Related U.S. Application Data

(60) Provisional application No. 60/803,016, filed on May 23, 2006.

(51) Int. Cl.
*H01J 37/304* (2006.01)
(52) U.S. Cl. .................. 250/309; 250/307; 250/492.21; 382/145; 438/14; 216/66
(58) Field of Classification Search .................. 250/307, 250/309
See application file for complete search history.

(56) References Cited

U.S. PATENT DOCUMENTS

| 5,140,164 | A |   | 8/1992 | Talbot et al. |
| 5,532,494 | A | * | 7/1996 | Kawanami et al. ....... 250/491.1 |
| 5,616,921 | A | * | 4/1997 | Talbot et al. ................ 250/307 |
| 6,031,229 | A | * | 2/2000 | Keckley et al. ............. 250/309 |

FOREIGN PATENT DOCUMENTS

WO WO 2006/050613 A1 5/2006

* cited by examiner

*Primary Examiner*—Jack I Berman
(74) *Attorney, Agent, or Firm*—Nixon Peabody LLP; Joseph Bach, Esq.

(57) ABSTRACT

A method, system and apparatus are presented for real time analysis of images in a focused beam system. In various embodiments, marker positions are displayed as graphical elements on the image of a sample being processed. Selected characteristics of all or a portion of the pixels in the image are used to determine the positions. The marker positions are used to detect the occurrence of an event such as an endpoint. In some embodiments attributes of the of the graphic elements change based on the occurrence of selected events and in further embodiments an action is initiated.

42 Claims, 10 Drawing Sheets

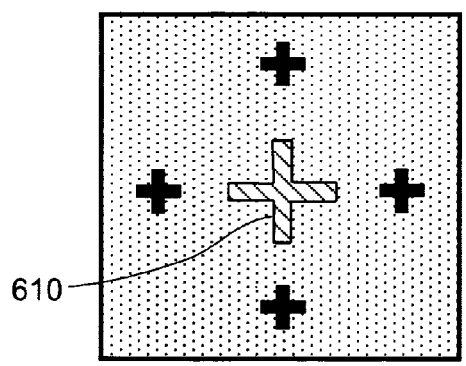 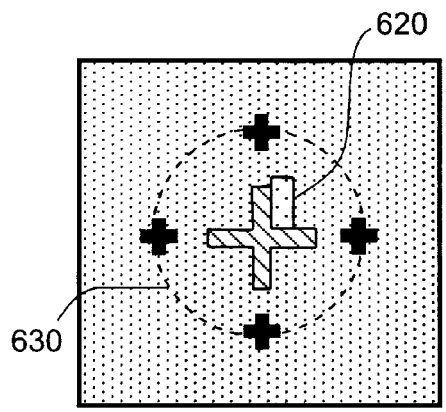
FIG. 6A					FIG. 6B
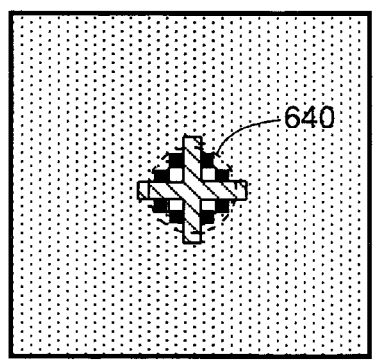 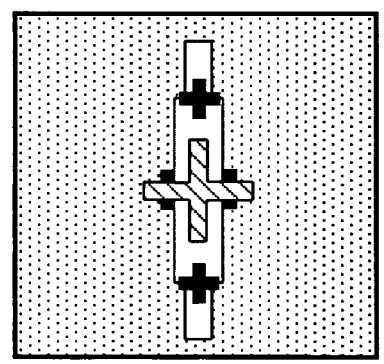
FIG. 6C					FIG. 6D

METHOD AND SYSTEM FOR IDENTIFYING EVENTS IN FIB

CROSS-REFERENCE TO RELATED APPLICATION(S)

The present application is related to and claims priority from U.S. Provisional Patent Application Ser. No. 60/803,016 filed on May 23, 2006, the entire disclosure of which is incorporated herein by reference.

DESCRIPTION OF RELATED ART

1. Field of the Invention

The present invention relates generally to particle beam systems for device processing. More specifically, the present invention relates to a method and system for ion beam system data to detect features and/or enhance endpointing.

2. Background

Focused ion beam (FIB) systems have been produced commercially for many years and now play an important role in bringing semiconductor devices to market. In the semiconductor industry, FIB systems are often used in such applications as defect analysis, circuit modification, mask repair and preparation of samples for electron microscopy. FIB systems produce a narrow, focused beam of ions and scan this beam across a semiconductor substrate. When the ion beam is directed onto a semiconductor surface, secondary elections, ions and neutral atoms and molecules are ejected.

By moving the beam across a semiconductor sample and controlling various beam parameters such as beam current, spot size, pixel spacing, and dwell time, the FIB can be operated as a near atomic scale milling tool for removing materials wherever the beam is placed. The dose, or amount of ions striking the sample surface, is generally a function of the beam current, duration of scan, and the area scanned. In some applications, a chemistry such as a halogen, in gaseous form, is introduced over the irradiated surface for enhancing film removal by ion assisted chemical etching reactions. These focused ion beam systems are often used for defining features in selected films.

Although material removal is a common application of FIB systems, these systems can also be used to deposit material. For example, a metal film-forming precursor, such as $W(CO)_6$, or a dielectric film forming precursor such as a siloxane type gas, can be introduced into an FIB system for depositing a conductor or dielectric. FIB deposition is useful in many applications, such as for repairing defects in lithographic masks or for depositing metallic "pads" to provide a connection point for probing during failure analysis.

It is often difficult to discern the portion of material that has been removed or deposited by ion beam processing. In normal operation, particles that are ejected as a result of ions striking the surface are sensed by detectors. By correlating the data from these detectors with the known position of the incident beam as it interacts with the substrate surface, an image can be produced and displayed to an operator. However semiconductor device features have continued to decrease in size and it is now necessary to process small and/or high aspect features with dimensions below 100 nanometers. This shrinkage, by requiring decreased beam flux, significantly reduces the number of secondary electrons and ions available for imaging and endpoint detection.

FIG. 1 is a block diagram showing some general elements of one FIB system. FIB system 10 includes an evacuated envelope 11 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y state 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10^{-7}$ Torr and $5\times10^{-6}$ Torr. If an etch assisting gas, an etch retarding gas, or a deposition precursor gas is used, the chamber background pressure may rise, typically to about $5\times10^{-5}$ Torr.

High voltage power supply 34 is connected to liquid metal ion source 14 and to appropriate electrodes in focusing column 16 directing the ion beam. Deflection controller and amplifier 36, operated in accordance with a prescribed pattern provided by pattern generator 38, is coupled to deflection plates 20 so as to steer the ion beam 18. A charged particle multiplier 40 detects secondary ion or electron emission for imaging, is connected to image processor. Image processor 42 also receives deflection signals from controller 36 and provides an image output to monitor 44. A door 60 is provided for Inserting sample 22 onto stage 24, which may be heated or cooled.

FIB system 10 may also include an analysis subsystem 100 comprising a processor and machine readable storage media. In some embodiments, the FIB analysis subsystem 100 is a separate system that independently runs its own image and data processing algorithms. In various embodiments, subsystem 100 comprises a computer workstation that receives pixel data and other signals from other parts of the system and independently runs its own image and data processing algorithms. In still more embodiments, the analysis subsystem 100 has a hardware interface to FIB control functions and can send image data to the image processor 42 for display on monitor 44. Focused ion beam systems are commercially available from various companies. The system shown in FIG. 1 represents merely one possible FIB system configuration.

During any beam operation executed by FIB system 10, which includes imaging, milling, gas assisted etching or deposition, the FIB beam deflection software and hardware deflects the beam in a preset pattern across the surface, generally referred to as rastering. At each preset location, the beam is left to dwell for a given period of time before moving to the next point in the raster. In a simple mode, a raster pass consists of deflecting the beam at fixed increments along a line parallel to one axis from a starting point to a terminal point, dwelling for a fixed dwell time at each point. At the end of a line, the beam waits a fixed retrace time before advancing an increment along a second axis. The beam may return to the start point of the first axis and begin again, or may begin "counting down" along the first axis from the terminal coordinate it had just reached (depending on whether the raster type is raster (the former) or serpentine (the latter). This process continues until all increments along both axes have occurred, and the beam has dwelled at all points in the scan.

Although FIB systems have found widespread use in semiconductor circuit manufacturing applications, the successful use of this tool relies on the precise control of the milling process. Current integrated circuits comprise multiple patterned layers of conducting material and insulating dielectrics, interlaced both vertically and horizontally. The milling rate and effects of ion beam milling on these various materials can vary vastly over a cross section of the device.

Generally, halting the milling process when designated material covering a feature, layer, or line has been removed is performed by a human operator. This endpointing of the process is done based on operator assessment of an image and other information displayed on user interfaces of the FIB system.

Unfortunately, it is often difficult to discern when to halt the milling process. In practice the local thickness of layers and the dimensions of features in a device vary to some degree. In addition, the ion milling rate is subject to variability from effects such as selective charging of insulated surfaces by the beam as well as dependence of the milling rates on local material composition. Hence ion milling generally first penetrates a material overlayer at those positions where the layer is relatively thin, and/or the FIB removal rate is relatively high. Furthermore, as milling continues, sublayer materials in already cleared areas are increasingly exposed to the milling beam and undergo erosion.

Thus it is often essential to halt the milling process as soon as the intended device feature is uncovered. Overetching can impair or destroy the usability of the device element being processed and/or adversely affect other elements. Underetching, on the other hand, also can have negative effects on intended device characteristics. For example, in applications where an insulating overlayer is milled to uncover a metal conductor line for electrical contact, underetching can leave debris that causes excessive contact resistance. Overetching, on the other hand, can induce high resistance by thinning the conductor line or may even sever it. Overetching past the line to lower levels of a device can also induce sputtering of conductive materials on sidewalls, thereby shorting two levels or causing other issues. Hence the success of an operation often depends on precise endpointing.

A number of signals have been used in connection with FIB endpoint detection. These include, among others, monitoring sample stage current, monitoring a secondary electron detector signal, monitoring a secondary ion signal and monitoring a photo-emission signal from excited secondary particles. Detecting an endpoint or other event often relies on detecting suitable signal changes in signal characteristics when a boundary surface or interface is encountered In general, these signals are displayed as real time images corresponding to a signal intensity as a function of position over the area being milled. These images are scrutinized in order to precisely resolve the time at which a desired area is uncovered.

In practice image analysis is often difficult. The images commonly suffer from noise, such as statistical noise and drift caused by, among other things, mechanical drift of the sample stage and charging of the substrate by the ion beam. Furthermore, milling often exposes unrelated features and artifacts that tend to mask initial stages of breakthrough when only a portion of the desired line or feature is first exposed. Oftentimes, these various factors make it difficult to perceive when the desired feature is first fully uncovered. It can also be difficult to confirm that the wanted targets, rather than unintended ones are uncovered. Consequently it is often difficult to avoid unnecessary milling of a line if a wrong one is exposed.

Hence there has been a long felt need for improved endpoint detection in FIB systems. Furthermore, there is a particular need for improved methods of analyzing real time images that are acquired during FIB scans for determining the endpoint when a feature is uncovered, and for characterizing the feature.

SUMMARY

The invention is directed to systems and methods for identifying events occurring when processing devices with a particle beam. Various embodiments are to analyze images acquired by a focused beam system such as a focused ion beam (FIB) system in real time based on the images. In some embodiments an action is initiated based on the occurrence of an event such as an endpoint. In embodiments, a method is provided for locating marker positions on the image of a sample being processed. In many of these embodiments graphical elements, referred to as fireflies, are superposed on the image of a sample being processed at the marker positions. The embodiments include selected characteristics of all or a portion of the pixels in the image to locate the marker positions. In some of these embodiments, the image processing method depends on a weighting based on intensity and position of the pixels. In a number of embodiments, attributes of the graphic elements change upon the occurrence of determined events, such as a reduction of the distance between the fireflies.

An aspect of the invention is a first method for processing a device with a particle beam. The method comprises receiving real time images of the device during the processing, sensing intensity differences between pixels within the images, superimposing graphical elements at determined positions on at least one image, and displaying at least a portion of the at least one image with the superimposed graphical elements in real time. The determined positions depend on the intensity differences between pixels. In a specific embodiment the particle beam is a focused ion beam.

Another aspect is finding a relationship of the determined positions without user interaction. In some of these other aspects, at least one of the graphical elements is distinctive and characteristic of finding the relationship. In another aspect, the relationship is of a difference image. Furthermore, in some aspects, the relationship is characteristic of an endpoint. In some embodiments an action is initiated upon finding the relationship.

In another embodiment of the first method, the graphical elements highlight some intensity differences between pixels. These intensity differences arise from a device feature being uncovered. In still another embodiment, some local intensity differences between pixels are highlighted that also arise from a device feature being uncovered.

In another aspect of the invention, a second method for processing a device, using a particle beam, comprises receiving images of the device during the processing, evaluating a plurality of marker positions in at least one of the images based on pixels in the at least one image, detecting a relationship of the marker positions, and initiating an action based on detecting the relationship. In this second method each marker position comprises a weighted average position of the pixels, the weighted average position comprises a weighting function multiplying the position of each pixel, and the weighting function depends on the position of the each pixel and on the intensity of the each pixel. In one aspect, the graphical markers converge to an exposed feature. In another aspect each of the marker positions in the absence of intensity bias has a position that is at least a preselected distance from every edge of the display. A further aspect has each of the marker positions in the absence of intensity bias in a determined position that is at least $\frac{1}{8}$ of the display width or more from every edge of the display. A still further aspect has the at least one of the images comprise at least two raster scans.

In various embodiments after the other aspect, the particle beam is a focused ion beam. In some embodiments the images are received in real time during device processing and the relationship is detected in real time. In still more embodiments the at least one of the images is a difference image.

There are various aspects in which the weighting function comprises a product of one weighting factor that depends on the each pixel position and another weighting factor that depends on the intensity $I_{r,c}$ of each pixel. In some of these various aspects the one weighting factor that depends on each pixel position does not explicitly depend on a pixel intensity, and the other weighting factor that depends on the intensity $I_{r,c}$ of each pixel does not explicitly depend on a pixel position. Further, in more of these aspects, the positional weighting factor depends on a normalized displacement from an edge of the image matrix.

In some aspects where the positional weighting function depends on a normalized displacement, the pixels of the image are in a matrix of rows and columns, four marker positions designated 1,2,3, and 4 are determined according to:

$$R_i = \frac{\sum_{r,c} w_i(r, c) w_I(I_{r,c}) r}{\sum_{r,c} w_i(r, c) w_I(I_{r,c})}$$

$$i = 1,2,3,4$$

$$C_i = \frac{\sum_{r,c} w_i(r, c) w_I(I_{r,c}) c}{\sum_{r,c} w_i(r, c) w_I(I_{r,c})}$$

$$i = 1,2,3,4;$$

and a fifth marker position is at an average position of the markers designated 1 through 4. In other aspects the weighting function comprises a product that depends on pixel position, and another that depends on the intensity, and at least one bright pixel associated with drift, the edge of a milling box, or an unassociated topographical feature, in single or combination, is masked.

In another embodiment of the second method, the plurality of marker positions comprises a central marker position and the central marker comprises an average position of other marker positions. In some of these other embodiments, at least one of the other marker positions comprises a positional weighting factor depending on a normalized displacement from a boundary of the one image to a pixel position.

In still another embodiment of the second method, the action comprises conspicuously displaying information concerning the relationship in real time. A further embodiment of the second method comprises displaying at least a portion of the one image in real time, and displaying graphical elements superimposed on the portion of the one image at marker positions within the portion. In an aspect of this further embodiment, a conspicuous attribute of at least one of the graphical elements changes responsive to detecting the relationship.

In yet still another embodiment of the second method, the relationship of the marker positions comprises a limitation selected from: no markers are separated by more than a predetermined number of pixels; two preselected markers are within a predetermined number of pixels of each other; any two of three preselected markers are within a predetermined number of pixels of each other; any two of three preselected first markers are within a first predetermined number of pixels of each other and at least two of three preselected second markers are more than a second predetermined number of pixels from each other; any two of three preselected first markers are within a first predetermined number of pixels of each other, at least two of three preselected second markers are more than a second predetermined number of pixels from each other, and any two of the three preselected second markers are within a third predetermined number of pixels of each other; and any two of three preselected first markers are within a first predetermined number of pixels of each other, and at least two of three preselected second markers are more than a second predetermined number of pixels from each other; and at least the three preselected first markers are substantially collinear or the three preselected second markers are substantially collinear, in single or in combination.

There are also embodiments of the second method where the action comprises: evaluating a plurality of marker positions in a next one of the digital images based on pixels in the next one of the digital images; detecting another relationship of the marker positions in the next one of the digital images; and initiating a further action based on detecting the other relationship in the next one of the digital images. Lastly, there is an embodiment of the second method where the action comprises displaying information concerning the event or sending a message concerning the event, in single or combination.

Another aspect of the invention is machine readable media having instructions and data operable for: receiving images of a device during particle beam processing, sensing intensity differences between pixels within the images, evaluating a plurality of marker positions based on the intensity differences between the pixels, detecting a relationship of the marker positions, and initiating an action based on detecting the relationship. In a further aspect of the machine readable media each of the marker positions comprises a weighted average of pixels in one of the images, the weighted average comprising a weighting function multiplying a position of each pixel in the one of the images, and the weighting function depending on the position of the each pixel and on the intensity of the each pixel. In some embodiments after this further aspect of the machine readable media, the instructions and data are operable for displaying at least a portion of the one image in real time with graphical elements superimposed on the image at least at some of the marker positions within the portion of the one image. A different aspect of the machine readable media has the instructions and data operable to implement a graphical user interface. The graphical interface has a method of providing graphical elements on a real time image of the device for enhancing the conspicuity of a processing event. In some of the different aspects, the action comprises a conspicuous graphical attribute that is characteristic of the event.

Another embodiment of the invention is an apparatus. The apparatus is for processing a device using an ion beam. The apparatus comprises means for receiving images of the device during processing; means for evaluating a plurality of marker positions in one of the images based on pixels in the one image; means for associating marker positions with an event; means for detecting a relationship between the marker positions; and means for initiating an action based on detecting the relationship;

An embodiment of the invention is another apparatus. It is for processing a device using an ion beam. This apparatus comprises: machine readable media operable to store data and instructions and at least one processor operable to perform the instructions and operate on the data. The instructions are operable for receiving images of a device being processed, evaluating a plurality of marker positions in one of the images based on pixels in the one image, detecting a relationship of the marker positions, and initiating an action based on detecting the relationship. In this apparatus, each of the marker positions comprises a weighted average position of the pixels. The weighted average comprises weighting function multiplying the position of each pixel, and the weighting function depending on the position of the each pixel and on the intensity of the each pixel. An embodiment after one aspect is for detecting endpoints and processing events in a host focused ion beam processing system. In one embodiment the standalone unit is passive.

A different aspect of the invention is a method of providing graphical elements in a particle beam device processing apparatus having a graphical user interface including a display and a selection device. The graphical elements are on a real time image of the device for enhancing the conspicuity of a processing event. The method comprises receiving real time digital images of the device during processing, evaluating a plurality of marker positions in at least one of the images based on the intensity of pixels of the images, displaying at least some of the images, and displaying graphical elements at the marker positions in the at least one of the images. In the method, each of the marker positions comprises a weighting function applied to the pixels. In one embodiment of the graphical element method, the weighted average comprises a weighting function multiplying the position of each pixel, and the weighting function depends on the position of the each pixel and on the intensity of the each pixel. In another embodiment, the method further comprises detecting a relationship of the marker positions and displaying at least one conspicuous graphical element characteristic of the relationship.

SUMMARY OF THE DRAWINGS

The accompanying drawings, which are incorporated in and constitute a part of this specification exemplify the embodiments of the present invention and, together with the description, serve to explain and illustrate principles of the inventive technique. Specifically, embodiments of the present invention will now be described, by way of example only, with reference to the attached figures, wherein:

FIG. 6A shows the positions of five fireflies based on spatial weighting when the intensity weighting is uniform;

FIG. 6B shows the positions of five fireflies when there is intensity weighting from a relatively dim feature;

FIG. 6C shows the positions of five fireflies when there is intensity weighting from a relatively bright feature; and FIG. 6D shows the positions of five fireflies when a line has been partly exposed;

DETAILED DESCRIPTION

Figure 1:
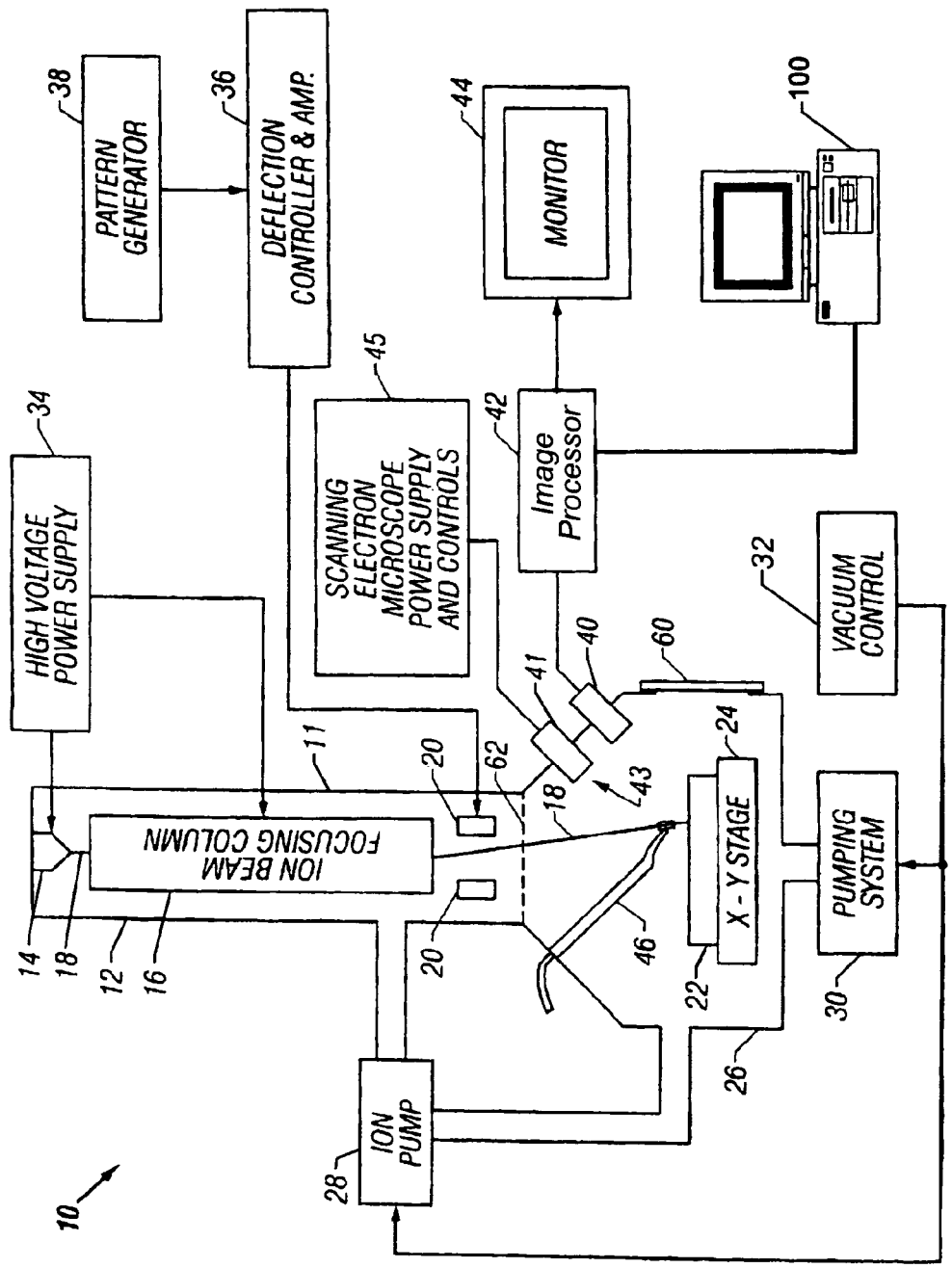
FIG. 1 is a block diagram showing some aspects of one focused ion beam system configuration.

The present description is directed to systems and methods for identifying events occurring when processing devices with a particle beam system. More particularly, various embodiments are to analyze images acquired by a focused beam system such as a focused ion beam (FIB) system in real time during processing, and identify events related to the processing, based on the images. In some embodiments an action is initiated based on the occurrence of an event. Furthermore, various embodiments enable characterizing a feature of a device being processed, and deciding an endpoint.

In various embodiments, a method is provided for locating marker positions on the image of a sample being processed. In many of these embodiments graphical elements, referred to herein as fireflies, are superposed on the image of a sample being processed at the marker positions. The embodiments include an image processing method that uses selected characteristics of all or a portion of the pixels in the image to locate the marker positions. In some of these embodiments, the image processing method depends on a weighting based on intensity and position of the pixels.

In a number of embodiments, colors of the graphic elements are static. In other embodiments, the color of graphic elements may change upon the occurrence of determined events, such as a reduction of the distance between the fireflies.

In another embodiment a system is presented. The system includes data and instructions stored in a machine readable media that are operable to implement the image processing method. The system also includes a processor operable to perform the instructions and operate on the data. Furthermore, the system includes a display for displaying images from milling a device and for superposing the fireflies.

It will be understood that, although the terms first, second etc. may be used to describe various elements, these terms are only used to distinguish one element from another and the elements should not be limited by these terms. For example, a first element could be termed a second element, and, similarly a second element could be termed a first element without departing from the scope of the instant description. The term "and/or" as used herein, includes any and all of the associated listed terms, in single or in combination. As used herein, the singular forms "a", "an" and "the" are intended to include the plural forms as well, unless the context clearly indicates otherwise. It will be further understood that the terms "comprises," "comprising," "includes," and/or "including" signify the presence of stated features, integers, steps, operations, elements, and/or components, but do not preclude the presence or addition of one or more other features, integers, steps, operations, elements, components, and/or groups thereof.

In the following detailed description, reference is made to the accompanying drawings of specific embodiments. The aforementioned drawings are to illustrate embodiments by way of particular examples, and are not intended to be limiting. These implementations are described in sufficient detail to enable those skilled in the art to practice the teachings. Various other embodiments and implementations are also consistent with principles of the present disclosure. It is to be understood that other embodiments and implementations may be utilized and that structural changes and/or substitutions of various elements may be made without departing from the scope and spirit of the present invention. The following detailed description is, therefore, not to be construed as limiting.

Figure 2:
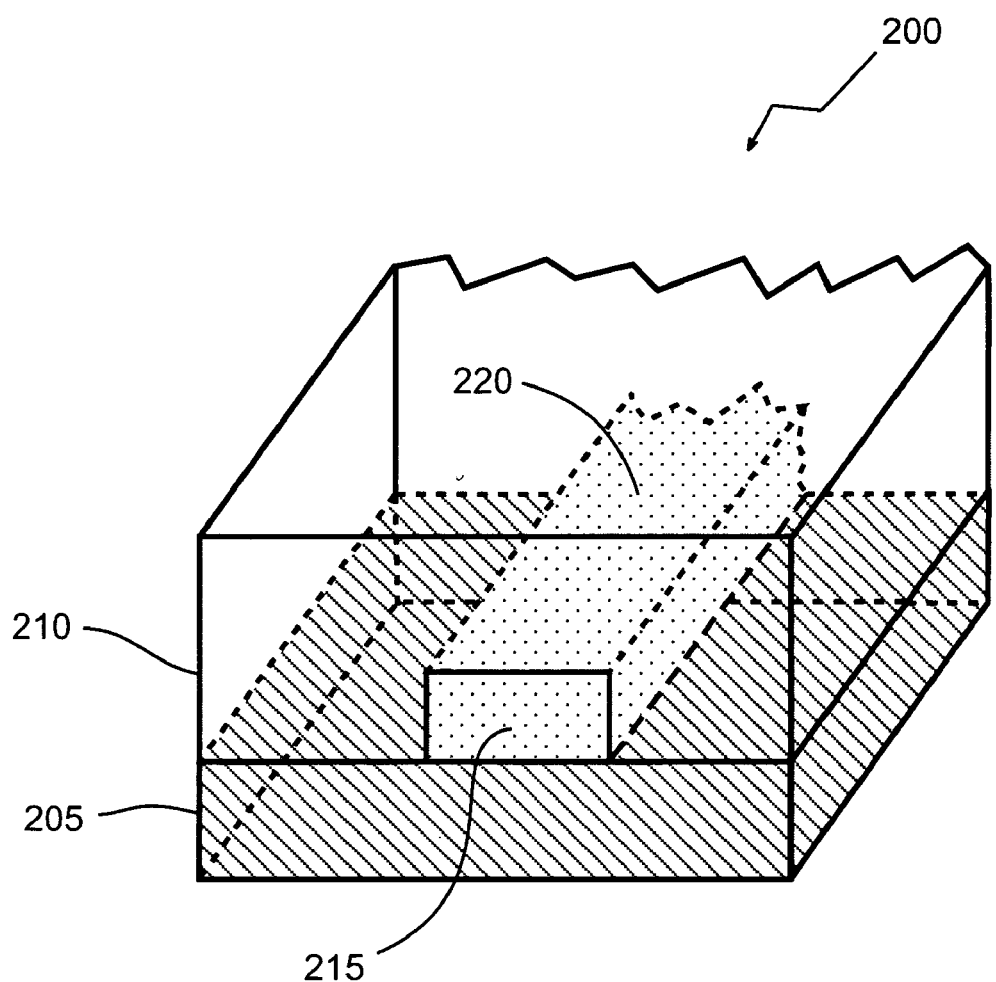
FIG. 2 is a view of a portion of an exemplary device to be processed.

One embodiment of a method can be understood in terms of milling a portion of an exemplary device 200, shown in FIG. 2. From the front side, with an illustrative FIB milling process, the progress of the mill is shown in plane view images of the top surface of at sequential times depicted in FIGS. 3A-3C. The portion of the FIB milled device 200 in FIG. 2 includes a first material layer 205, a rectangular line 215 comprised of a second material on the top surface of the first layer, and a third material overlayer 210 covering the first layer and the line. It is often desired to remove a sufficient amount of the third material overlayer to fully uncover the top surface 220 of line 215. Hence the endpoint of the milling operation is when the top surface 220 is fully uncovered.

Figure 3A:
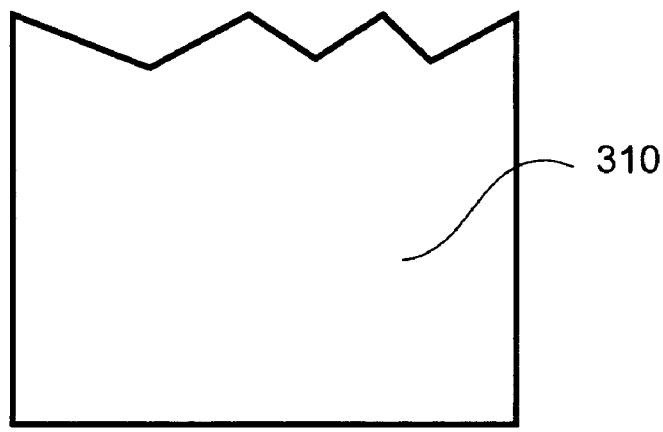
FIG. 3A illustrates an initial FIB image just after milling of the section shown in FIG. 2 has started.
Figure 3B:
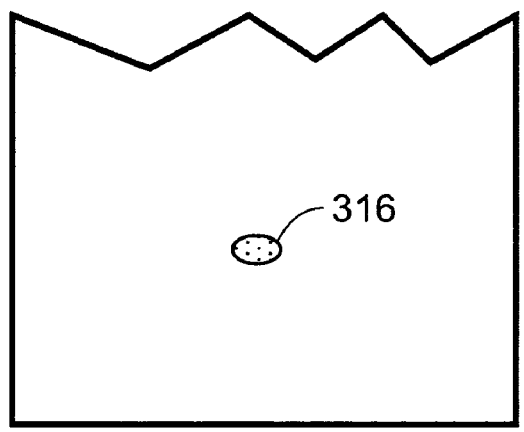
FIG. 3B illustrates an FIB image of the portion shown in FIG. 2 after a small portion of the top surface of the line has been uncovered.
Figure 3C:
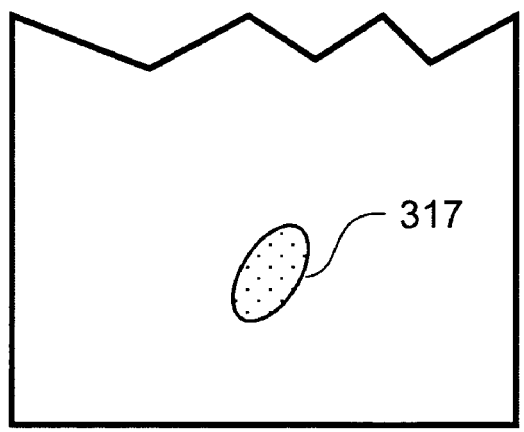
FIG. 3C illustrates another FIB image of the portion shown in FIG. 2 after a greater portion of the line surface has been exposed.

FIG. 3A is a diagrammatic representation of an FIB image, showing a plane view of the upper surface of the device as it appears on an FIB display just after milling has started. At this time, the line 220 of FIG. 2 remains covered by the overlayer material 210. FIG. 3B is a diagram of another FIB image at a later time when a small portion 316 of top surface 220 of the line 215 has been uncovered by ion milling. Although intensity differences arising from the portion 316 are apparent in FIG. 3B, a small feature of this kind is often hard to perceive on an actual operator display, owing to noise and low contrast. FIG. 3C is another diagram of an FIB image at a still later time when a greater portion 317 of the line surface has been exposed. Although the portion 317 is plain in the diagram, on an actual display it is often difficult to perceive owing to noise, position dependent variations in background intensity, and/or low contrast.

According to an embodiment for improving the conspicuity of exposed layer areas, five graphical elements, referred to herein as fireflies, are superimposed on the FIB display of images in FIG. 3A-3C, as illustrated in FIGS. 6A-6D. In the embodiment, these five fireflies highlight the uncovering of a line portion under the overlayer film. Hence the conspicuous relationship of the fireflies makes the milling and exposure of the line evident to the operator, thereby facilitating control of the milling and endpointing.

To facilitate the following explanation, the term "fireflies" is often used to reference graphical elements at determined positions (marker positions) on the scan image. However, there are embodiments where graphical icons for some marker positions are not displayed. For example, in some embodiments a small portion of scanned FIB image is displayed that does include some of the marker locations (the firefly positions). In some embodiments "missing" fireflies are not shown, and in other embodiments each of the "missing" graphical elements is indicated by a characteristic graphical element at the boundary location most proximate to its "virtual" location (icons used to represent missing fireflies often have a conspicuous characteristic shape or attribute, such as blinking, a more or less saturated color, etc.).

In various embodiments, an action is automatically initiated based on detecting a relationship between the determined positions of markers (firefly positions) in the scan image. In some of these embodiments, the determined positions are represented by graphical elements (fireflies) on a physical display. In other embodiments, only certain graphical elements are displayed, and in still further embodiments no graphical elements are displayed. Hence the term "fireflies" will be understood to refer to the designated marker positions in the scanned image and/or to displayed graphical elements corresponding to the designated positions.

Figure 4:
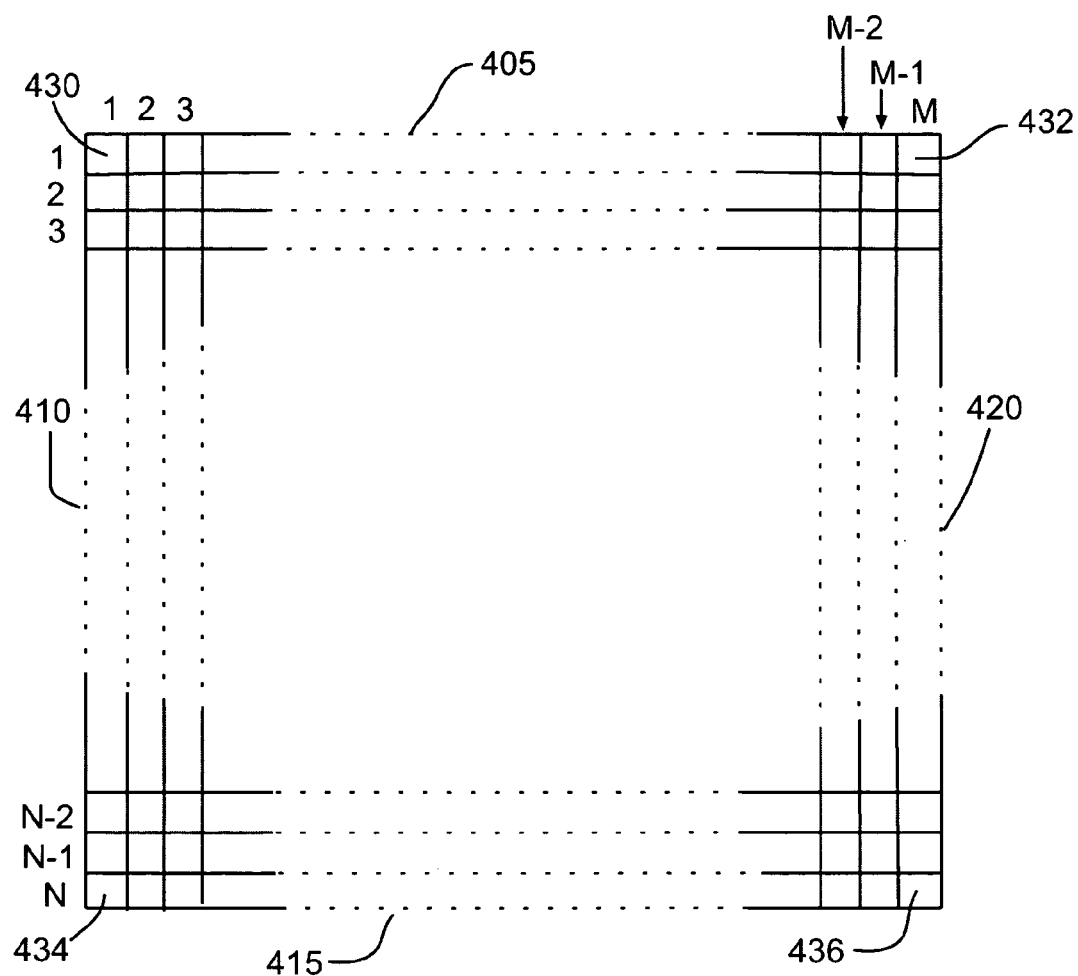
FIG. 4 illustrates numbering of the rows and columns of a display in an embodiment of the invention.

FIG. 4 shows one coordinate system that is often used for referencing the pixels of an image. This coordinate system is useful for explaining an embodiment. However other coordinate systems can also be used and the scope of embodiments does not depend on the selection of any particular coordinate system. According to FIG. 4, a matrix comprised of rows of pixels are numbered sequentially beginning with row 1 at the top 405 of the display. The columns of pixels are numbered in a sequence beginning with column 1 at the left edge 410 of the display. Hence the pixel in the upper left hand corner 430 is referenced by the coordinates (1,1). Similarly, for a display having N rows and M columns, the pixel referenced as (1,M) is at the $M^{th}$ column in row 1 of the display, at the upper right hand corner 432. Also, pixel (N,1) is at the lower left hand corner 434 and pixel (N,M) is at the lower right hand corner 436.

According to various embodiments, a predetermined number n of fireflies are provided. In some embodiments, the fireflies are designated as i=1,2,3, n. The positions of the fireflies are weighted averages of the pixel positions. In various embodiments, the weighting function used to form the weighted averages often depends on the pixel position coordinates r,c (row r and column c) and the intensity $I_{r,c}$ of the pixel at (r,c). In some of the various embodiments, the pixel position weighting function comprises a product of one weighting factor that has no explicit dependence on the positional coordinates (r,c), and a second weighting factor that is independent of the intensity $I_{r,c}$ of the pixel at (r,c). In a number of embodiments, the position of one firefly is based on the average position of a selected set of the n-1 other fireflies.

According to some embodiments, there are five fireflies. The positions of four fireflies, designated as i=1, 2, 3 and 4, are weighted averages of the pixel positions determined according to Equation 1:

$$R_i = \frac{\sum_{r,c} w_i(r,c) w_I(I_{r,c}) r}{\sum_{r,c} w_i(r,c) w_I(I_{r,c})}$$

$$i = 1,2,3,4$$

$$C_i = \frac{\sum_{r,c} w_i(r,c) w_I(I_{r,c}) c}{\sum_{r,c} w_i(r,c) w_I(I_{r,c})}$$

$$i = 1,2,3,4$$

Equation 1

Here $R_i$ is the row position of firefly i, $C_i$ is the column position of firefly i, $w_i(r,c)$ is a pixel position weighting factor that depends on the position of a pixel in the image (e.g. the coordinates row r and column c), $w_I(I_{r,c})$ is a weighting factor that depends on intensity $I_{r,c}$ of the pixel at (r,c), and the summation is over all of the pixels (e.g. the rows and columns) of the image. The position of the fifth firefly, referred to as the center firefly, is at the average position of fireflies 1 through 4 according to:

$$R_5 = \frac{1}{4}(R_1+R_2+R_3+R_4), \quad C_5 = \frac{1}{4}(C_1+C_2+C_3+C_4).$$

Equation 2

In one preferred embodiment, four distinct positional weighting factors $w_i(r,c)$ are used to position each of the four different fireflies. The positional weighting factors for the four fireflies are:

$$w_1(r,c) = (c/\text{width})^2,$$

$$w_2(r,c) = (1-c/\text{width})^2,$$

$$w_3(r,c) = (r/\text{height})^2, \text{ and}$$

$$w_4(r,c) = (1-r/\text{height})^2 \quad \text{Equation 3}$$

In Equation 3, "width" is the total width of the image in pixels and "height" is the total height of the image in pixels. Hence for an image matrix of N rows and M columns, N is the height and M is the width. Each of these positional weighting factors favors pixels located away from one of the four boundary edges of the image matrix. With reference to FIG. 4, it can be seen that $w_1(r,c)$ favors pixels located away from the left edge 410; $w_2(r,c)$ favors pixels located away from the right edge 420; $w_3(r,c)$ favors pixels located away from the bottom edge 415; and $w_4(r,c)$ favors pixels located away from the top edge 405. Normalization of the top and bottom row displacements to height according to Equation 3 (e.g. r/height, [height−r]/height) and the left and right column displacements to the width (e.g. h/width, [width−c]/width) is to make the embodiment of positional weighting factors relatively neutral to the size of an image in pixels.

Various other coordinate systems can be used to reference the pixels of the image, depending on the embodiment. It will be apparent to those having ordinary skill in the art that where another coordinate system is used, the weighting function is transformed into the other coordinate system using well known standard transformations.

Figure 5:
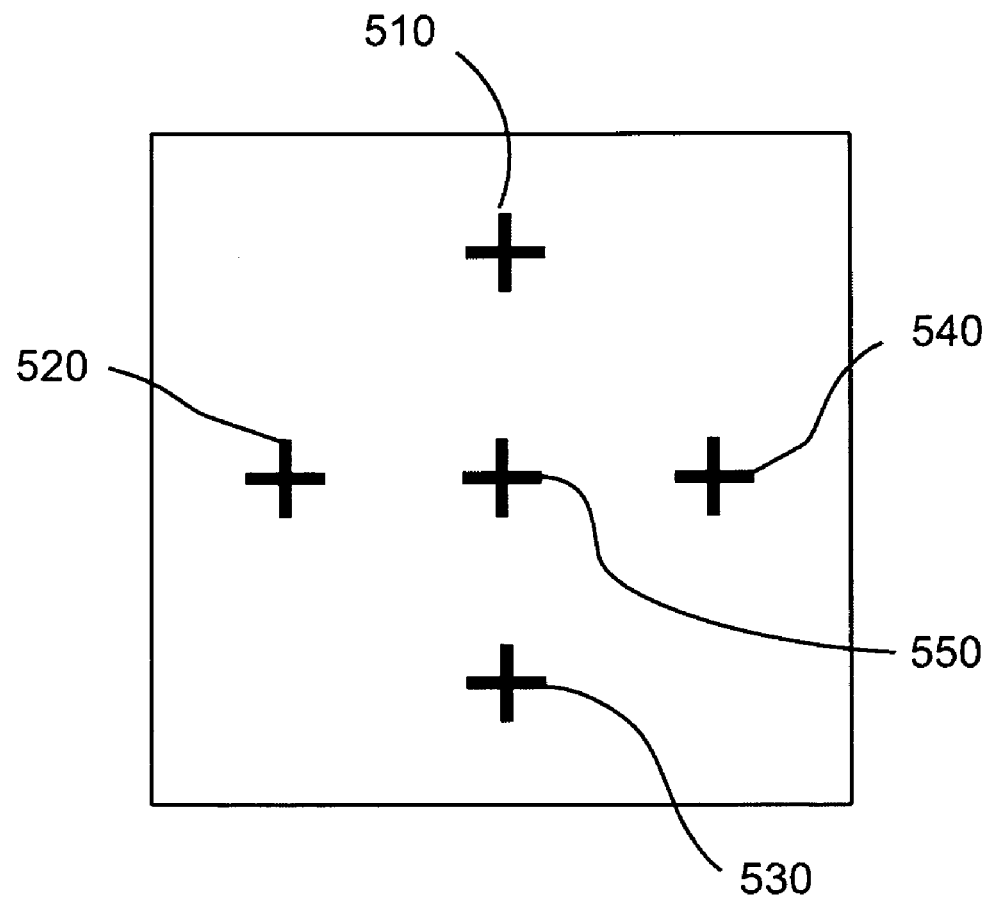
FIG. 5 shows positions of five fireflies based on spatial weighting.

A simplified example illustrates the configurational influence of positional weighting according to equation 3. If the intensity weighting factor is constant (e.g. $w_f(I_{r,c})$=Constant, which is sometimes referred to as "no intensity bias"), the positional weighting factors $w_i(r,c)$ determine the four firefly positions 510, 520, 530, 540 shown in FIG. 5. Two of these are at positions approximately ¼ and ¾ of the width at mid-height of the display, and the remaining two fireflies are at positions approximately ¼ and ¾ of the height at mid-width of the display. These first four firefly positions are arranged in a cross pattern and the fifth, center firefly, is at the center 550 of the cross. In further embodiments, larger or smaller numbers of fireflies are configured according to various other positional weighting functions and patterns. In still further embodiments every firefly in the absence of intensity bias has a determined position that is at least ⅛ of the display width or more from every edge of the display.

Another simplified example illustrates the configurational influence of intensity weighting based on Equation 1. If the positional weighting factors are constant, (e.g. $w_i(r,c)$ have a constant value independent of r and c), and intensity weighting $w_f(I_{r,c})$ is made proportional to intensity (e.g. $w_f(I_{r,c})$=Const*$I_{r,c}$ for all r,c), then all five fireflies will have identical coordinates, e.g. $R_i$, $C_i$ are the same for i=1-5. This common position of the five fireflies is at what is sometimes referred to as the intensity center of mass of the image. By comparing pure intensity weighting with pure positional weighting, it can be seen that as the firefly position-determining weighting factors transition from being purely positional to being purely intensity-dependent, the fireflies converge from the characteristic cross pattern positions in (FIG. 5) to a point at the intensity center of mass.

In many applications, devices are often covered by a uniform material overlayer before milling (e.g. FIG. 3A). Consequently, the image of this uniform overlayer will initially exhibit a relatively uniform intensity and intensity-dependent weighting will have approximately the same value at all positions. Hence at the early stages of the mill, the weighting function will be almost purely positional and the firefly positions will form the characteristic positional cross pattern discussed in connection with FIG. 5. As milling progresses the intensity becomes heterogeneous, as when, for example, an underlying area or feature is exposed as depicted in FIG. 3B. As the spatial distribution of intensity becomes heterogeneous, the intensity-dependent weighting factor has increasing influence on the firefly positions. As already pointed out, the influence of a proportional intensity weighting is to "pull" or "attract" the firefly positions toward the intensity center of mass.

Various other intensity weighting dependencies are useful, depending on the application. In general, it has been found that a transition from a relatively uniform device image intensity, to one having nonuniformities from features that are exposed during milling, tends to move fireflies from determined positions based on the spatial coordinate weighting factors (e.g. Equation 3 in the embodiment) to positions reflective of sensing intensity differences. Thus in various embodiments the fireflies are "attracted" to bright areas of the image.

As can be understood, if the exposed underlayer would exhibit a lower intensity than the overlayer (e.g. the underlayer is darker), an inverse of the image can be used so that the fireflies are effectively attracted to the darker areas. In some embodiments, firefly positions are effectively based on an inverse image that is the difference between the actual intensity and a global baseline, as described in more detail below.

It has been observed that the absolute brightness of the image is often affected by ion beam and machine parameters, material properties, signal processing, and various other factors. Furthermore, some overlayers are brighter than the underlying features of interest uncovered by ion milling. Hence for detecting device features, it is often desirable for the firefly positions to be responsive to local intensity differences while being relatively insensitive to the global intensity of an image.

In a number of embodiments it has been found that an intensity weighting based on a difference between the actual intensity of each pixel and a global baseline intensity of the entire image, or of a cropped portion of that image, is advantageous. In various embodiments where the feature of interest is brighter than the a background, a useful baseline intensity is often selected as:

$$I_{Base} = \min[I_{r,c}] \quad \text{Equation 4}$$

where $\min[I_{r,c}]$ is the smallest intensity value among all of the pixels in the image. In various other embodiments where a feature of interest is darker than the brightness of an overlayer, a useful baseline intensity is often selected as:

$$I_{Base} = \max[I_{r,c}] \quad \text{Equation 5}$$

In these various embodiments having brighter or darker features, an intensity weighting factor $w_f(I_{c,r})$ is often selected to be a power of an offset absolute value, as follows:

$$w_f(I_{r,c}) = \beta(|I_{r,c} - I_{Base}| + 1)^\gamma \quad \text{Equation 6}$$

Here the exponent γ adjusts the sensitivity of the algorithm to relative brightness and β is adjusted to effectively scale intensity weighting relative to positional weighting. Since this intensity weighting factor $w_f(I_{r,c})$ is relative to a baseline intensity rather than absolute intensity, a uniform global shift of pixel intensity to higher or lower values has no effect on the positions of the fireflies. Hence in these embodiments, when transitions between layers merely cause the entire image to grow brighter or darker, the fireflies do not converge or otherwise respond in a way that could be mistaken for an endpoint signal.

It will be seen that large values of $\gamma$, such as $\gamma=5$, increase the relative influence of high brightness difference pixels (e.g. relative to the baseline) on the calculated position of fireflies. Large values of $\gamma$ thus cause fireflies to rapidly converge toward a high brightness difference spot (e.g. a bright spot where the background is dark), when one appears. On the other hand, large values of $\gamma$ also make the positions of fireflies relatively sensitive to statistical noise in the image. When the firefly positions are sensitive to statistical noise there is often significant jitter in their position over time as milling progresses, even when there are no discernable features in the image.

Relatively low values of $\gamma$ (e.g. $\gamma \leq 2$), on the other hand, have less sensitivity to intensity differences. When $\gamma$ is relatively low, only pixels with large brightness differences produce substantial firefly convergence. Hence it is seen that relatively low values of $\gamma$ result in reduced sensitivity to relative brightness, on the one hand, while providing increasing resilience to noise in the image before a feature is uncovered by milling, on the other hand.

Since the position of fireflies depends on the intensity difference between brighter and darker pixels, adjusting the contrast of the image can affect firefly positions. However, when there are no significant features in the image, greater contrast will mainly result in a noisier image and have no significant effect on firefly positions. When there is a feature, on the other hand, increased contrast generally causes the fireflies to converge toward a feature more quickly. In various embodiments noise is reduced by basing each evaluation of firefly positions on an average image comprising a preselected number of prior scans. In still further embodiments various other intensity weighting factors are used.

FIGS. 6A-6D illustrate the operation of an embodiment where a mill progresses through a uniform dielectric layer to expose a horizontal line segment underneath the layer. The positions of fireflies in the embodiment are based on Equations 1, 2 and 3. The image comprises a detector intensity signal stimulated by the focused ion beam on the layers. In this embodiment, the detector signal is averaged in time to obtain an improved signal to noise ratio for processing. At the beginning of the mill as depicted in FIG. 6A, the intensity of the signal from the planar dielectric layer surface is substantially uniform. Since there is substantially no intensity variation at this time (e.g. $I_{r,c}$ and thus $w(I_{r,c})$ are substantially uniform) the five firefly positions are in a cross pattern as shown, corresponding to summation of the spatial intensity factor $w_i(r,c)$ with no intensity bias, according to Equations 1-3.

In a number of embodiments, the fireflies have distinctive shapes, sizes, coloring and/or other attributes that are selected to enhance visual conspicuity. For example, in one embodiment the size of the central cross icon 610 is larger than the other four firefly crosses. Furthermore, in this embodiment the central cross normally has a magenta hue, whereas the four surrounding firefly crosses are red. In other embodiments various other distinctive icons are useful for highlighting.

In the final stages of milling before breakthrough, as for example when milling in the illustrative embodiment progresses from FIG. 6B to FIG. 6C, a feature appears and subsequently becomes brighter. When the dielectric has been milled to the point that it is close to breaking through to an area 620 of the line surface 220 of FIG. 2, as shown in FIG. 6B, the image signal intensity at the nascent breakthrough point 620 has become slightly brighter than the surrounding area. If the sensitivity factors $\beta$ and $\gamma$ are sufficiently high, the slight intensity increase at 620 will cause the fireflies to move toward the nascent breakthrough point, as depicted in FIG. 6B.

A convergence criterion is often set to detect the occurrence of an event at an early stage. In some embodiments the criterion for an event such as nascent breakthrough is that all of the fireflies are within a circle of selected radius. For example, an incipient breakthrough is detected in some embodiments when the marker positions are within a selected first radius 630, as shown illustratively in FIG. 6B. When an event such as incipient breakthrough is detected, a conspicuous characteristic of one or more of the fireflies is changed without user interaction (e.g. automatically changed). For example, the color of the center firefly is changed from magenta in FIG. 6A to cyan in FIG. 6B for signaling the incipient breakthrough to the operator. In some embodiments, the colors and sizes of the different fireflies are coded to identify the current state of a mill and/or the occurrence of various events.

A variety of signals and alarms are useful for signaling an event, depending on the application. For example, in one embodiment an audible alarm is turned on when the fireflies are within a predetermined number of pixels of each other that is associated with a final breakthrough stage. In another embodiment, a warning image is flashed on the screen and a broadcast warning message is sent from the FIB system through an IP port to hosts on a local area network. These are merely illustrative signals and are not limiting.

As the milling penetrates the film and increasingly exposes underlying line material, the feature often becomes brighter as shown in the progression from FIG. 6A to FIG. 6C. The fireflies become attracted to the bright area even more strongly by the intensity weighting $w(I_{r,c})$ bias. A smaller second convergence circle 640 is to detect when milling has progressed from incipient breakthrough to actual breakthrough. When the fireflies are within the smaller radius 640, graphical interface features signal actual breakthrough.

A variety of different criteria can be applied to detect various events, depending on the application. For example, in some applications one convergence criterion is that no fireflies are separated by more than a predetermined number of pixels (another way of stating this is that the fireflies are in a relationship wherein no fireflies are separated by more than a predetermined number of pixels). In another embodiment, detecting the relationship that two preselected markers within a predetermined number of pixels of each other triggers an action. In a further embodiment, an event is associated with the relationship that any two of three preselected markers are within a predetermined number of pixels of each other.

In various embodiments, an action is initiated upon detecting the associated relationship. For example, in some embodiments selected milling parameters change without user inaction, upon detecting a relationship between fireflies. In various embodiments, an event such as nascent breakthrough to a contact is often associated with the relationship that all of the fireflies are within a predetermined distance of each other. In a number of embodiments an action is that the milling rate is reduced and/or milling is stopped without user interaction, upon the occurrence of an event. Changing milling parameters without user interaction often affords an operator greater latitude to deliberate and "tune" a milling operation (for example, slowing the milling operation without user interaction often affords an operator more time to make a decision before unwanted milling takes place).

In yet another embodiment, a selected line convergence criterion is that two opposite fireflies are within a selected distance of each other (e.g. the criterion is satisfied when the fireflies are in the relationship of being within a selected distance of each other). This criterion has been found useful for detecting the endpoint when milling to horizontal or vertical lines which sometimes open up quickly. In still further embodiments different convergence criteria are selectable, depending on device and milling requirements.

FIG. 6D shows a configuration of fireflies in the embodiment after milling has progressed beyond breakthrough and fully exposed an extended area of the underlying line. After breakthrough, as the line is exposed, the two opposing vertical fireflies spread apart from the breakthrough point along the spatially distributed bright area of the line. At endpoint convergence, the two opposing vertical fireflies are separated by more than a first predetermined distance, and two other horizontal opposing fireflies are closer than a second predetermined distance (e.g. the horizontal fireflies are sufficiently close together and the vertical fireflies are sufficiently far apart).

In many of these embodiments the orientation of a line is detected very soon after a portion of the line is exposed. Among many advantages provided, this allows the operator to confirm that the proper milling target was obtained and to prevent unnecessary milling in cases where the wrong target is erroneously selected. Once the fireflies have converged in conformity with the selected breakthrough relationship, further milling of the overlying dielectric generally uncovers additional portions of the line segment, as shown in FIG. 6D. As the illustrative vertical line segment is uncovered, the top and bottom vertical fireflies spread along the length of the line, as shown. The left side and right side horizontal fireflies, on the other hand, remain close to each other touching the uncovered central portion of the line. In many embodiments where a line is being exposed, these relative distances between fireflies are used to detect, at a very early stage of the exposure, whether the line is vertical or horizontal. In still further embodiments a different positional graphical marker weighting function is used to sense lines having various other orientations. Merely by way of example, in one embodiment a spatial weighting factor that favor pixels located at a distance from each of the corners is useful for identifying diagonal lines.

The embodiments are not limited to any particular orientation or to merely detecting any particular stage of the milling process. In various embodiments certain events are sensed without user interaction (i.e. the certain events are automatically detected) through detecting an associated relationship, and an action is initiated without user interaction based on detecting the relationship. Sensed events often include incipient breakthrough, breakthrough, detecting a line orientation, and others. In some of these embodiments the action includes changing the mill process parameters, displaying graphical information concerning the event, and sending a message concerning the event by notification means such as activating a visual alarm signal for the operator, emitting an audible alarm, sending a message to a receiver destination over a network, broadcasting a message to a network, and others.

When performing certain milling processes, it has been found that there is sometimes a tendency for the edges of a milled area to become bright relative to other areas. For example, in many embodiments where the image is based on secondary electron emission, the edges of a rectangle milled in a dielectric initially grow brighter as it is milled. It is believed that the reason for this effect is that the edges of the rectangle become slightly rounded, and the yield of electrons from ions striking the rounded surface at off-normal incidence is higher than for ions striking planar areas at normal incidence. It has been found that a bright edge often tends to attract the firefly located nearest to it. Hence the bright edges of a rectangular mill box sometimes attract and pull fireflies apart, depending on the dimensions of the rectangle.

In some embodiments the spreading effects of brightness at one or more edges of a mill box is sufficiently strong to adversely affect the convergence of fireflies to a feature as it is uncovered. However, bright edges surrounding a mill box image are generally easy to detect. In various embodiments, the putative effect of mill box edge brightness on convergence is suppressed by effectively excluding pixels at the edges of a mill box from the calculations. In embodiments, the pixels at these the bright edges are effectively masked by assigning the weighting function a value of zero at pixel positions corresponding to the bright edges (or equivalently they can be excluded from the calculations). In some embodiments where the weighting function is a product of a factor depending on pixel position and another factor depending on pixel intensity, the positional factor is assigned a value of zero at the bright edge pixel positions.

In some embodiments it has been found that an image sometimes drifts in one direction. Image drift is believed to be caused by mechanical motion (instability) of the sample being milled and/or sample charging. When there is a directional drift, relatively bright pixels at one edge of a large mill box may move into the field of view while pixels at the opposing edge may move out of the field of view. In a few embodiments, other bright pixel configurations that were not associated with the milling endpoint have been observed. For example, bright features are sometimes associated with topographical features that are unimportant for the operation being performed. Although bright pixels associated with drift, the edge of milling boxes, unassociated topographical features, and other factors occasionally have adverse effects on firefly convergence, these effects are effectively negated by excluding such areas from the computations of firefly positions. Thus bright areas associated with drift, unassociated topographical features and other factors are often masked. One means for masking or excluding these areas from the calculations is to assign the positional weighting factor of these areas zero, or relatively small values, at coordinate positions within the areas that are to be excluded. A positional weighting factor is relatively small if the product of the positional weighting factor and its associated intensity weighting factors is less than the median value of the weighting function (i.e. the product or the positional and intensity weighting factors) for unmasked (e.g. included) pixels of the image. In a still further embodiment, the motion of the firefly positions is useful for steering the ion beam to correct for sample drift.

In further embodiments, detecting events such as endpoints is based on fireflies of a difference image. In some of these embodiments, a difference image is often based on those pixels which have intensity changing with time. In other words, the fireflies are based on pixel intensities $I_{r,c,diff}(t)$ of a difference image formed by evaluating:

$$I_{r,c,diff}(t)=I_{r,c}(t)-I_{r,c}(t_{ref}) \quad \text{Equation 6}$$

where $I_{r,c}(t)$ is the intensity of a pixel position at time t and $I_{r,c}(t_{ref})$ is the intensity of the pixel position at an earlier time $t_{ref}$. The difference image has the advantage that features which are relatively static are substantially removed in the difference image. Hence when milling in an area that has static or nearly static features, attraction of fireflies to constant or relatively constant features is avoided or minimized when the firefly positions are determined from an intensity weighting factor based on $I_{r,c,dif}(t)$. For example, firefly positions corresponding to equation 1 are determined from an intensity weighting factor based on $I_{r,c,dif}(t)$ by substituting $I_{r,c,dif}(t)$ into the selected intensity weighting factor when evaluating the sum. That is, $w_I(I_{r,c})$ in equation 1 is evaluated according to:

$$w_I(I_{r,c})=w_I(I_{r,c,dif})=w_I\{I_{r,c}(t)-I_{r,c}(t_{ref})\}.\qquad\text{Equation 7}$$

In some embodiments the reference time is a certain selected (static) time. In other embodiments the reference time is dynamically set to be at a selected interval before the current time, (e.g. $t-t_{ref}$=constant). In still further embodiments the interval from the reference time to the current time decided dynamically based on a heuristic. In one embodiment a static reference time $t_{ref}$ is selected at the start of a milling step. In some other embodiments, time a static time is selected in different ways. For example, in certain embodiments $t_{ref}$ is selected to be after a rectangular milling box is formed and before any significant underlying features are detectable. By using a difference image in the embodiments, the attraction of fireflies to bright edges of the milling box is suppressed.

In further embodiments the reference time of the difference image $t_{ref}$ is automatically updated, depending on selected variables such as time, cumulative ion flux, and/or sensing of one or more events. In some of these embodiments, for example, when no significant feature is apparent and a threshold amount of drift has moved the bright edge of a milling box into the image field of view, the reference image is updated in order to eliminate this interference. In some embodiments, the reference of a difference image is updated at when convergence of the fireflies signal incipient breakthrough. Hence subsequent firefly positions are exclusively sensitive to brightness differences that appear from that point on, which enhances sensitivity for detecting final breakthrough and endpoint.

Also, in some embodiments various images are selected, depending on the process and device. For instance, in one embodiment a first active reference image is selected at the onset of processing, and another reference image is selected after sufficient time to form a mill box has elapsed, yet well before an incipient endpoint. In another embodiment, still a third reference image is selected when incipient breakthrough is detected. Also, in some embodiments fireflies detection is based on a combination of techniques. In still other embodiments selected pixels are blanked from a difference image based on analyzing intensities of the undifferenced parent image $w_I\{I_{r,c}(t)\}$. Various criteria and terms are often advantageously combined to form difference images in still further ways, depending on the application.

Figure 7:
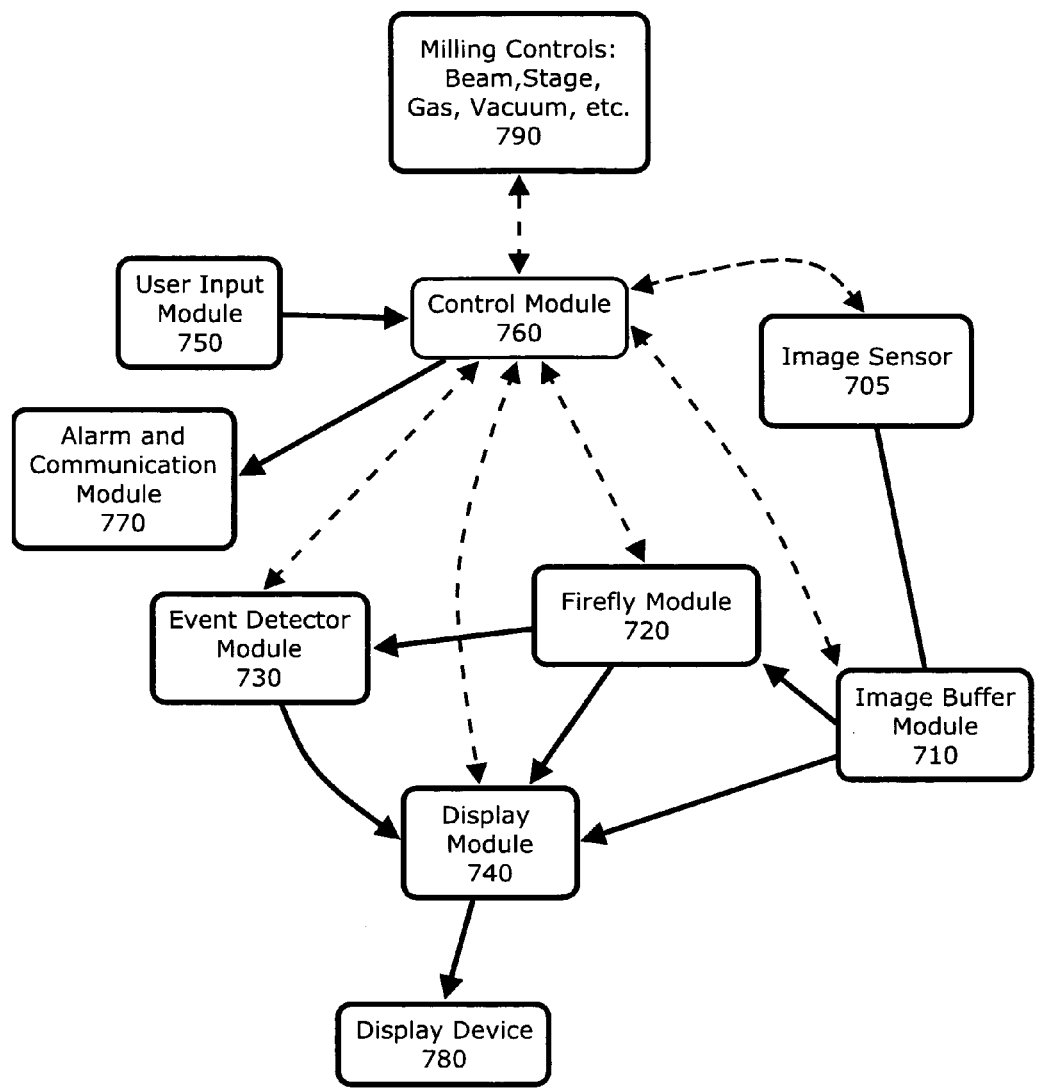
FIG. 7 is a block diagram showing some aspects of an embodiment.

FIG. 7 illustrates simplified aspects of data flow in an embodiment. The embodiment is in a focused ion beam system that has a processor and machine readable media including storage for instructions and data operable by the processor to implement various modules. The embodiment includes a user input interface module 750, a control module 760, an image sensor module 705, an image buffer module 710, a firefly module 720, an event detector module 730, a display module 740, a display device 780 and milling controls 790. The image sensor 705 receives an image of a device being processed with a focused ion beam and sends a matrix of pixel data comprising the image to image buffer module 710. Image buffer module may optionally average or apply other signal conditioning to the image and is operable to store a selected reference image in processor readable memory. Firefly module 720 evaluates firefly coordinates for the most recent image data and sends the coordinates to event detector module 730 and display module 740. Event detector module 730 receives the most recent firefly coordinates and tests the coordinates for preselected conditions such as converging within a radius that signals an event. Event detector module 730 sends detected events to display module 740 and to control module 760. Display module 740 is operable to receive a current image from the image buffer and generate a display based on the firefly coordinates, detected events, a stored reference image, and various other parameters such as milling variables. Display module 740 sends the updated display to display device 780. Alarm and communication module 770 is operable to send alarms and notices to various instrumentalities (audible alarms, visual alarms, IP messages, etc.) for control module 760, based on event notification.

In the embodiment, control module 760 is operable to receive user input and set functional parameters that control operations of the image sensor module, image buffer module, firefly module, event detector module, display module and user input modules, as well as selected functions of the control module itself. Control module 760 also receives milling parameters and status information from other parts of the ion milling system by way of milling controls interface 790 (i.e. beam control, sample stage, gas controls, vacuum system and others). The control module 760 is further operable to set milling process parameters and control the milling process by way of milling controls interface 790. Discrete milling operations, such as starting and/or stopping a defined process, are often performed responsive to user directions that are communicated to the control module 760 from the user input module 750. However control module 760 is also operable to perform a vast variety of automatic operations without user interaction. These operations include, without limitation, changing mill parameters, stopping the mill, and/or sending an alarm such as an audible alarm or IP messages to hosts on a network when event detector module 730 detects an endpoint or other condition according to user defined criteria.

While the various modules in the embodiment are implemented by a processor operable to perform program code, in various other embodiments some portions, or all portions of these functional modules are implemented by control circuitry. Also, in other embodiments the functionality may be implemented with different architectures and further embodiments some functionality is omitted. For example, in one embodiment the functionality of the control, firefly and event detector modules are combined into a single logical module. In another embodiment, there is no alarm module (the event based actions are characteristic notifications from a display device). Furthermore, while firefly positions in the exemplary embodiments comprise spatial and intensity weighting over image pixels, in various other implementations fireflies comprise filtering based on other methods in the spatial or frequency domains. For example, transforms such as Fourier transforms, wavelet transforms, Hough transforms, Canny transforms and others, in single or in combination, are used in various embodiments.

In further embodiments various functions described in connection with FIG. 7 are unimplemented. For example, one relatively simple embodiment shown in FIG. 8 comprises a native commercial FIB system 810 that has basic functionality. A standalone endpointing and event processing unit 840 according to the present teachings is interfaced to system 810 by way of a hardware interface 820, a bus 830 or the like, and interfacing software. In some embodiments, the interface 820 from the native system 810 to the standalone unit 840 merely receives ("eavesdrops" on) the signals in the native system. In these embodiments, the standalone unit 840 is "passive" with respect to the native system 810 in that it does not inject signals into the native buses or otherwise control milling parameters. In various embodiments, the interface acquires signal data for every ion beam dwell point. The data acquired often includes real time x-y coordinate and pixel intensity data from the native system 810. Oftentimes, the native system includes a display 815 that is not adaptable to receive input from the standalone unit 820.

Figure 8:
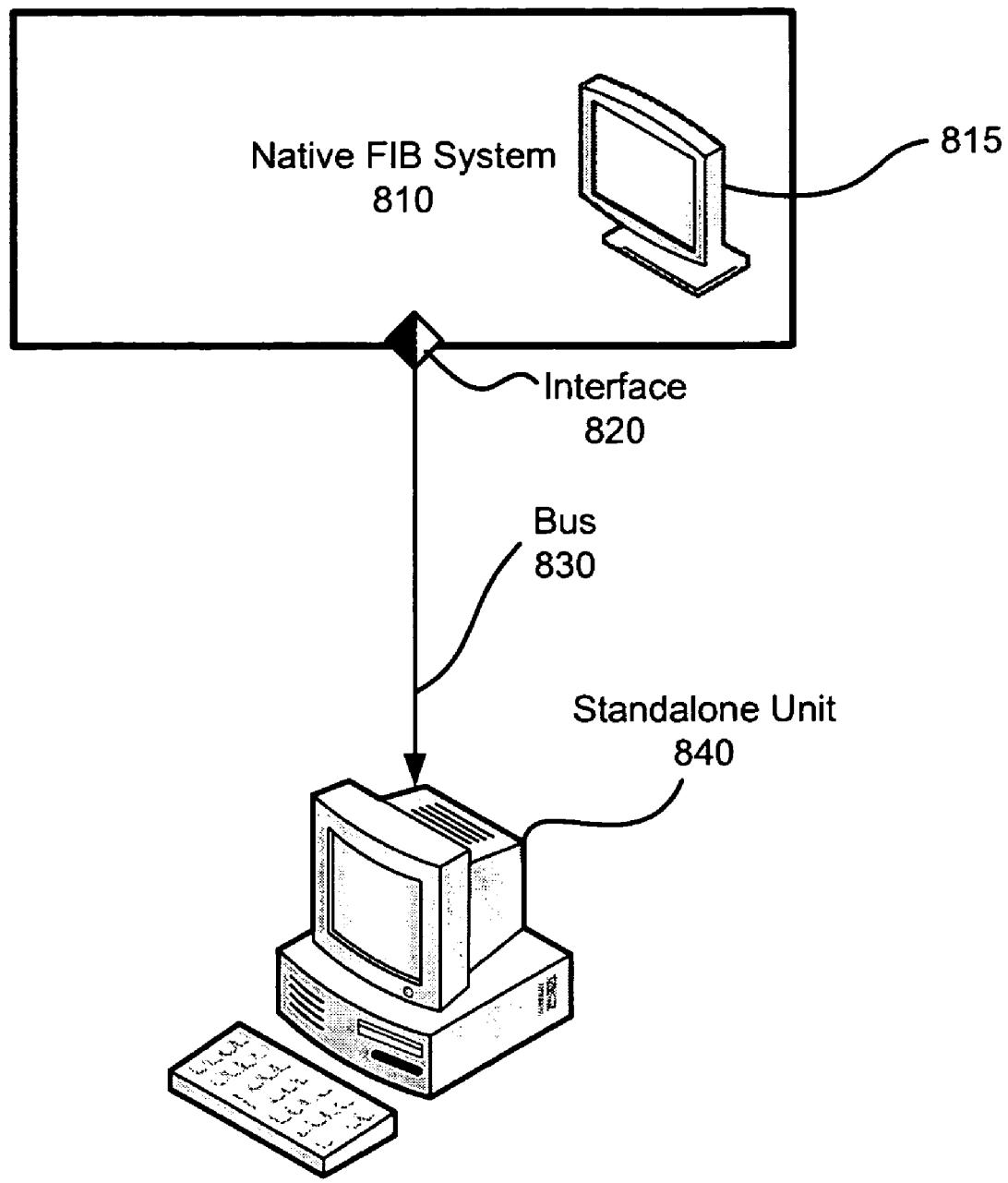
FIG. 8 shows a standalone unit connected to a native FIB system.
Figure 9:
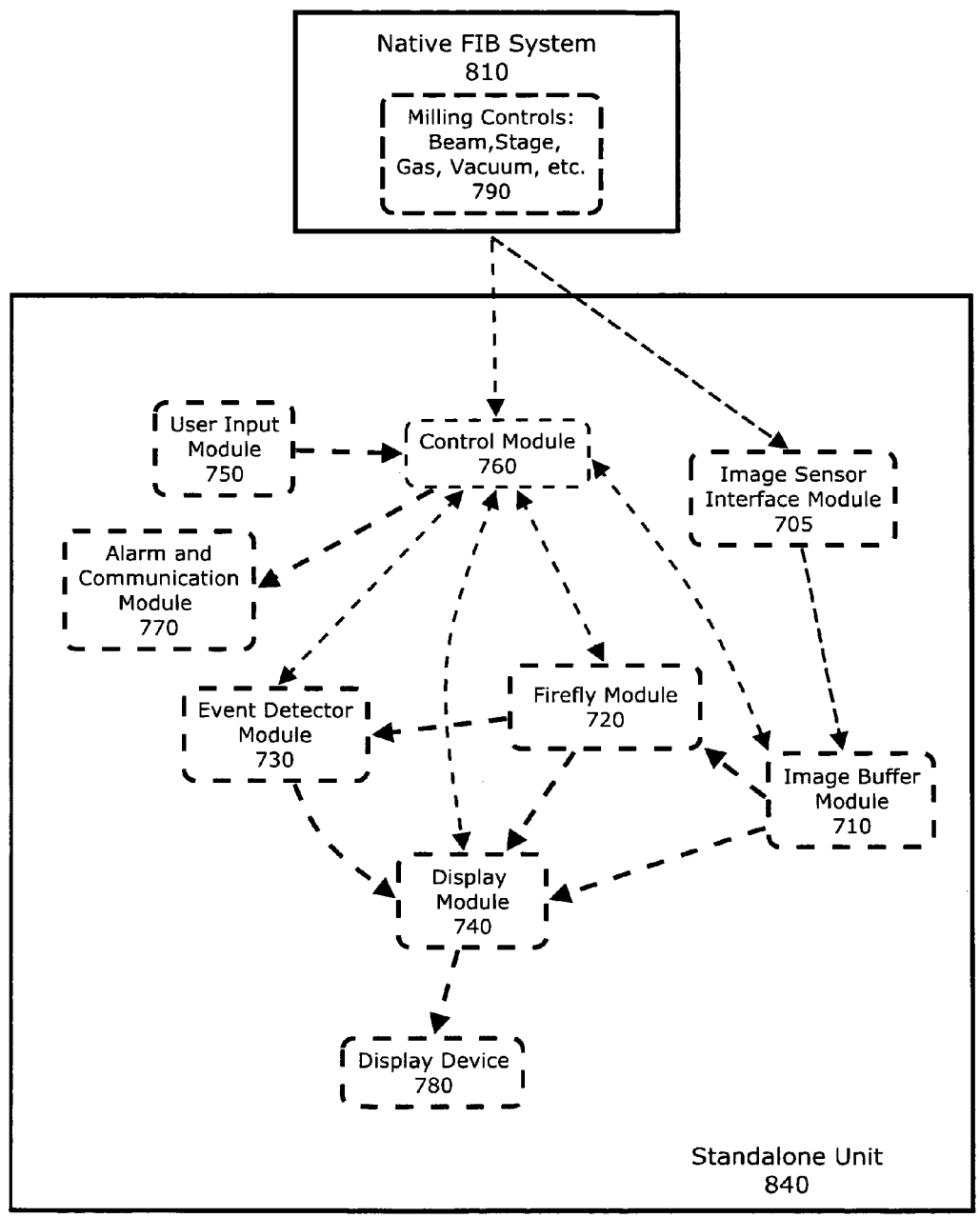
FIG. 9 shows further aspects of the stand alone unit connected to a native FIB system.

In embodiments having a passive interface between a native system and standalone unit after FIG. 8, milling controls 790 reside in the native system as shown in FIG. 9. In these embodiments no information or milling parameters can be sent from control module 760 to milling controls 790. As shown in FIG. 9, the data flows from native system 810 into standalone unit 840 comprising control module 760 are unidirectional to the standalone unit. The standalone unit embodiment depicted in FIG. 9 comprises a user input module 750, an image sensor interface module 705, an image buffer module 710, a firefly module 720, an alarm and communication module 770, an event detector module 730, a display module 740 and a display device 780, as well the control module 760 that receives data from the native FIB system. The image sensor interface module 705 is to receive image data from an image sensor in the native system. However some of these modules are unimplemented in various embodiments. Furthermore, some further embodiments implement the functionality associated with the modules shown in FIG. 9 using different logical architectures, and different hardware and software.

Figure 10:
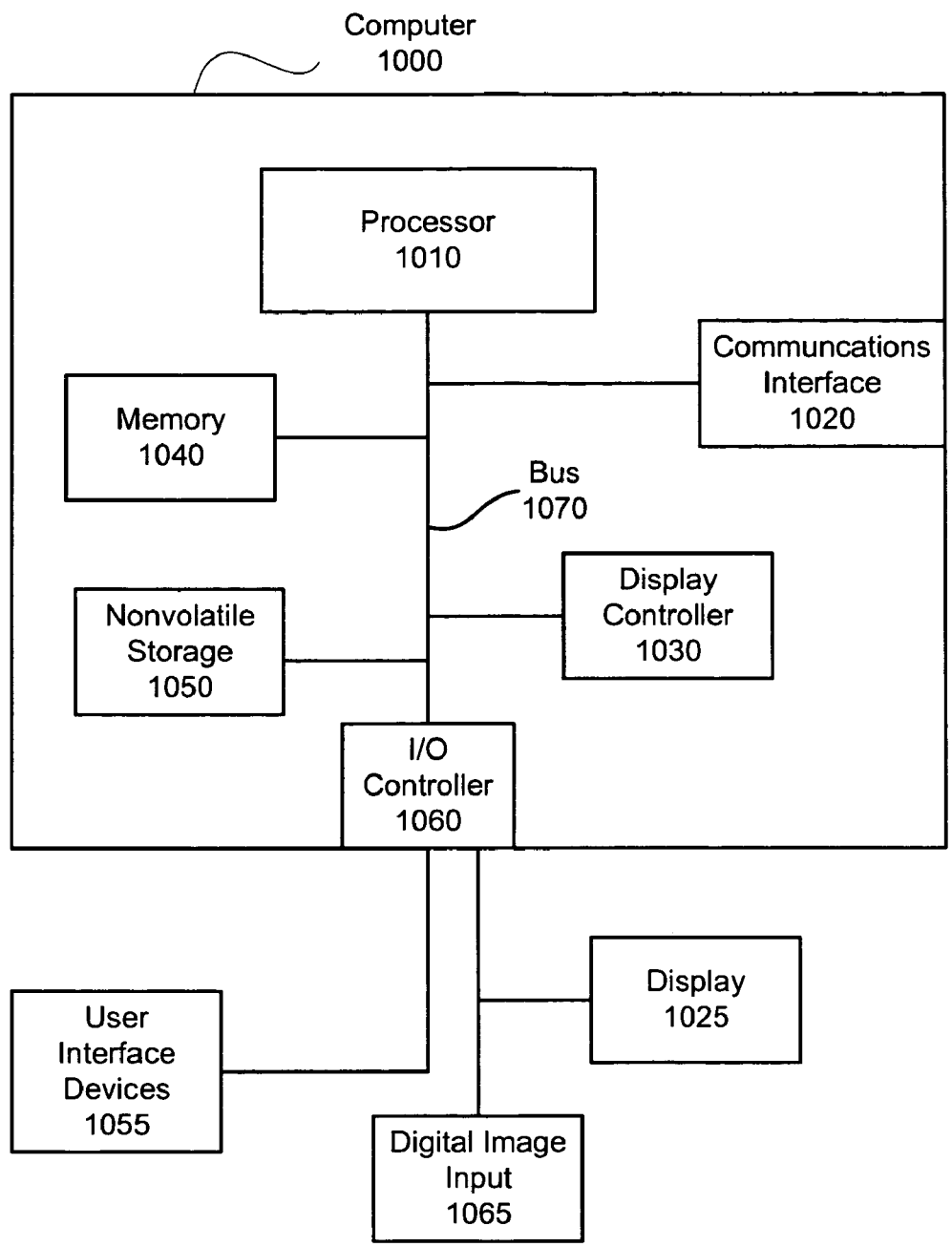
FIG. 10 illustrates one portion of a system for focused ion beam processing according to the present invention.

FIG. 10 illustrates a portion of a system for focused ion beam processing according to an embodiment. Such a system can be used to perform many operations, depending on implementation, such as physical ion milling, chemical ion milling, ion assisted deposition, or similar functions. The focused ion beam system includes a computer subsystem 1000, user interface devices 1055, image input 1065 and display 1025. The computer 1000 includes interfaces to external systems through the communications interface 1020. This interface is typically some form of cable and/or wireless interface for coupling to a personal computer, and may include a radio interface for communication with a network such as an 802.11 wireless network. Of course various networks and communication methods such as a Bluetooth, an infrared optical interface, and others can be used depending on the application.

The computer subsystem 1000 includes a processor 1010, which can be a conventional microprocessor such as an Intel Pentium microprocessor, an IBM power PC microprocessor, a Texas Instruments digital signal processor, or some combination of various types of processors, depending on the embodiment. Memory 1040 is coupled to the processor 1010 by a bus 1070. Memory 1040 can be dynamic random access memory (DRAM) and can also include static ram (SRAM), flash memory, magnetic memory (MRAM) and other types, depending on the application. The bus 1070 couples the processor 1010 to the memory 1040, also to non-volatile storage 1050, to display controller 1030, and to the input/output (I/O) controller 1060. In some embodiments, various combinations of these components are integrated in a single integrated circuit or in a combination of integrated circuits that are combined into a single package. Note that the display controller 1030 and I/O controller 1060 are often integrated together, and the display may also provide input.

The display controller 1030 controls in the conventional manner of a display controller on a display device 1035 which typically is a liquid crystal display (LCD), plasma display or similar flat-panel display. I/O devices 1055 can include user interface devices such as a mouse, a trackball, a graphics tablet, a touch-screen, a keyboard, and may sometimes be extended to include other input and output devices such as when a microphone and/or camera is configured to recognize voice and/or gesture inputs. The display controller 1030 and the I/O controller 1060 can be implemented with conventional well known technology. A digital image input device 1065 can be an image processor according to FIG. 1 which couples from the image signal source to an I/O controller 1060 or through a separate interface in order to allow images to be input into the subsystem 1000.

The non-volatile storage 1050 is often a magnetic hard disk, flash memory or some combination of the two and sometimes includes another form of storage for archiving large amounts of data. Some of this data is often written, by a direct memory access process, into memory 1040 during execution of software in the device 1000. One of skill in the art will immediately recognize that the terms "machine-readable medium" or "computer-readable medium" includes any type of storage device that is accessible by the processor 1010 and also encompasses a carrier wave that encodes a data signal.

The subsystem including computer 1000, I/O devices 1055, display 1025 and image input 1065 is one example of many possible systems which have different architectures. For example, devices based on an Intel microprocessor often have multiple buses, one of which can be an input/output (I/O) bus for the peripherals and one that directly connects the processor 1010 and the memory 1040 (often referred to as a memory bus). The buses are connected together through bridge components that perform any necessary translation due to differing bus protocols.

In addition, the device 1000 is controlled by operating system software which may include a file management system, such as a disk operating system, which is part of the operating system software. One example of an operating system with its associated file management system software is the family of operating systems known as Windows XP® from Microsoft Corporation of Redmond, Wash., and their associated file management systems. Another example of an operating system with its associated file management system software is the Unix® operating system and its associated file management system. The file management system is typically stored in the non-volatile storage 1050 and causes the processor 1010 to execute the various acts required by the operating system to input and output data and to store data in memory, including storing files on the non-volatile storage 1050.

System 1000 may be integrated into a single platform in some embodiments, although it often comprises of physically separate subsystems coupled by way of communications interfaces. Thus, it is not uncommon for a processor, bus, onboard memory, and display-I/O controllers to all be integrated within one display unit that receives image data from an image processor or video circuit in another unit comprising the ion beam column, vacuum chamber, and auxiliary equipment. The various functions may be split into multiple circuit boards, or may be included on a single circuit board with point-to-point interconnection, causing the bus to be logically apparent but not physically obvious from inspection.

One skilled in the art will appreciate that while specific examples and embodiments of the methods and apparatus have been described for the purposes of illustration, various modifications can be made without deviating from the spirit and scope of the present invention. For example, features of one embodiment may be incorporated into other embodiments, even where those features are not described together in a single embodiment within the present document. Accordingly, the invention is described by the appended claims.

What is claimed is:

1. A method for processing a device with a particle beam, the method comprising:
   receiving real time images of the device during the processing,
   sensing intensity differences between pixels within the images,
   superimposing graphical elements at determined positions on at least one image, and
   displaying at least a portion of the at least one image with the superimposed graphical elements in real time;
   wherein the determined positions depend on the intensity differences between pixels.

2. The method of claim 1 further comprising finding a relationship of the determined positions without user interaction.

3. The method of claim 2 wherein at least one of the graphical elements is distinctive and characteristic of finding the relationship.

4. The method of claim 2 wherein the relationship is of a difference image.

5. The method of claim 2 wherein an action is initiated upon finding the relationship.

6. The method of claim 2 wherein the relationship is characteristic of an endpoint.

7. The method of claim 1 wherein the graphical elements highlight some intensity differences between pixels, the intensity differences arising from a device feature being uncovered.

8. The method of claim 1 wherein the graphical elements highlight some local intensity differences between pixels, the local intensity differences arising from a device feature being uncovered.

9. The method of claim 1 wherein the particle beam is a focused ion beam.

10. A method for processing a device using a particle beam, the method comprising:
    receiving images of the device during the processing;
    evaluating a plurality of marker positions in at least one of the images based on pixels in the at least one image;
    detecting a relationship of the marker positions; and
    initiating an action based on detecting the relationship;
    wherein each marker position comprises a weighted average position of the pixels; the weighted average position comprises a weighting function multiplying the position of each pixel, and the weighting function depends on the position of the each pixel and on the intensity of the each pixel.

11. The method of claim 10 wherein the particle beam is a focused ion beam.

12. The method of claim 10 wherein the images are received in real time during device processing and the relationship is detected in real time.

13. The method of claim 10 wherein the at least one of the images is a difference image.

14. The method of claim 10 wherein the weighting function comprises a product of one weighting factor that depends on the each pixel position and another weighting factor that depends on the intensity $I_{r,c}$ of the each pixel.

15. The method of claim 14 wherein the one weighting factor that depends on the each pixel position does not explicitly depend on a pixel intensity, and the other weighting factor that depends on the intensity $I_{r,c}$ of the each pixel does not explicitly depend on a pixel position.

16. The method of claim 14 wherein the positional weighting factor depends on a normalized displacement from an edge of the image matrix.

17. The method of claim 16 wherein:
    the pixels of the image are in a matrix of rows and columns;
    four marker positions designated 1,2,3, and 4 are determined according to:

$$R_i = \frac{\sum_{r,c} w_i(r,c) w_I(I_{r,c}) r}{\sum_{r,c} w_i(r,c) w_I(I_{r,c})}$$

$$i = 1,2,3,4$$

$$C_i = \frac{\sum_{r,c} w_i(r,c) w_I(I_{r,c}) c}{\sum_{r,c} w_i(r,c) w_I(I_{r,c})}$$

$$i = 1,2,3,4;$$

and a fifth marker position is at an average position of the markers designated 1 through 4.

18. The method of claim 14 wherein at least one bright pixel associated with drift, the edge of a milling box, or an unassociated topographical feature, in single or combination, is masked.

19. The method of claim 10 wherein the graphical markers converge to an exposed feature.

20. The method of claim 10 wherein each of the marker positions in the absence of intensity bias has a position that is at least a preselected distance from every edge of the display.

21. The method of claim 10 wherein each of the marker positions in the absence of intensity bias has a determined position that is at least ⅛ of the display width or more from every edge of the display.

22. The method of claim 10 wherein the at least one of the images comprises at least two raster scans.

23. The method of claim 10 wherein the plurality of marker positions comprises a central marker position and the central marker comprises an average position of other marker positions.

24. The method of claim 23 wherein at least one of the other marker positions comprises a positional weighting factor depending on a normalized displacement from a boundary of the one image to a pixel position.

25. The method of claim 10 wherein the action comprises conspicuously displaying information concerning the relationship in real time.

26. The method of claim 10 further comprising displaying at least a portion of the one image in real time, and displaying graphical elements superimposed on the portion of the one image at marker positions within the portion.

27. The method of claim 26 wherein a conspicuous attribute of at least one of the graphical elements changes responsive to detecting the relationship.

28. The method of claim 10 wherein the relationship of the marker positions comprises a limitation selected from:
    no markers are separated by more than a predetermined number of pixels;
    two preselected markers are within a predetermined number of pixels of each other;
    any two of three preselected markers are within a predetermined number of pixels of each other;
    any two of three preselected first markers are within a first predetermined number of pixels of each other and at least two of three preselected second markers are more than a second predetermined number of pixels from each other;

any two of three preselected first markers are within a first predetermined number of pixels of each other, at least two of three preselected second markers are more than a second predetermined number of pixels from each other, and any two of the three preselected second markers are within a third predetermined number of pixels of each other; and any two of three preselected first markers are within a first predetermined number of pixels of each other, and at least two of three preselected second markers are more than a second predetermined number of pixels from each other; and at least the three preselected first markers are substantially collinear or the three preselected second markers are substantially collinear, in single or in combination.

29. The method of claim 10 wherein the action comprises:
evaluating a plurality of marker positions in a next one of the digital images based on pixels in the next one of the digital images;
detecting another relationship of the marker positions in the next one of the digital images; and
initiating a further action based on detecting the other relationship in the next one of the digital images.

30. The method of claim 10 wherein the action comprises displaying information concerning the event or sending a message concerning the event, in single or combination.

31. Machine readable media having instructions and data operable for:
receiving images of a device during particle beam processing,
sensing intensity differences between pixels within the images,
evaluating a plurality of marker positions based on the intensity differences between the pixels,
detecting a relationship of the marker positions, and
initiating an action based on detecting the relationship.

32. The machine readable media of claim 31 wherein each of the marker positions comprises a weighted average of pixels in one of the images, the weighted average comprising a weighting function multiplying a position of each pixel in the one of the images, and the weighting function depending on the position of the each pixel and on the intensity of the each pixel.

33. The machine readable media of claim 32 wherein the instructions and data are operable for displaying at least a portion of the one image in real time with graphical elements superimposed on the image at least at some of the marker positions within the portion of the one image.

34. The machine readable media of claim 31 wherein the instructions and data are operable to implement a graphical user interface having a method of providing graphical elements on a real time image of the device for enhancing the conspicuity of a processing event.

35. The machine readable medium of claim 34 wherein the action comprises a conspicuous graphical attribute that is characteristic of the event.

36. An apparatus for processing a device using an ion beam comprising:
means for receiving images of the device during processing;
means for evaluating a plurality of marker positions in one of the images based on pixels in the one image;
means for associating marker positions with an event;
means for detecting a relationship between the marker positions; and
means for initiating an action based on detecting the relationship.

37. An apparatus for processing a device using an ion beam comprising:
machine readable media operable to store data and instructions;
at least one processor operable to perform the instructions and operate on the data;
the instructions being operable for:
receiving images of a device being processed;
evaluating a plurality of marker positions in one of the images based on pixels in the one image;
detecting a relationship of the marker positions; and
initiating an action based on detecting the relationship;
wherein each of the marker positions comprises a weighted average position of the pixels; the weighted average comprising a weighting function multiplying the position of each pixel, and the weighting function depending on the position of the each pixel and on the intensity of the each pixel.

38. The apparatus of claim 37 wherein the apparatus is for detecting endpoints and processing events in a host focused ion beam processing system.

39. The apparatus of claim 38 wherein the standalone unit is passive.

40. In a particle beam device processing apparatus having a graphical user interface including a display and a selection device, a method of providing graphical elements on a real time image of the device for enhancing the conspicuity of a processing event, the method comprising:
receiving real time digital images of the device during processing;
evaluating a plurality of marker positions in at least one of the images based on the intensity of pixels of the images;
displaying at least some of the images; and
displaying graphical elements at the marker positions in the at least one of the images;
wherein each of the marker positions comprises a weighting function applied to the pixels.

41. The particle beam device processing apparatus of claim 40 wherein the weighted average comprises a weighting function multiplying the position of each pixel, and the weighting function depends on the position of the each pixel and on the intensity of the each pixel.

42. The method of claim 40 further comprising detecting a relationship of the marker positions and displaying at least one conspicuous graphical element characteristic of the relationship.

* * * * *